(12) United States Patent
Liu et al.

(10) Patent No.: US 11,239,256 B2
(45) Date of Patent: Feb. 1, 2022

(54) DISPLAY SUBSTRATE, MANUFACTURING METHOD THEREOF, DISPLAY PANEL, AND DISPLAY DEVICE

(71) Applicant: BOE TECHNOLOGY GROUP CO., LTD., Beijing (CN)

(72) Inventors: Dongni Liu, Beijing (CN); Can Wang, Beijing (CN); Minghua Xuan, Beijing (CN); Lei Wang, Beijing (CN); Li Xiao, Beijing (CN); Liang Chen, Beijing (CN); Shengji Yang, Beijing (CN); Pengcheng Lu, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 169 days.

(21) Appl. No.: 16/465,292

(22) PCT Filed: Nov. 28, 2018

(86) PCT No.: PCT/CN2018/117952
§ 371 (c)(1),
(2) Date: May 30, 2019

(87) PCT Pub. No.: WO2019/205624
PCT Pub. Date: Oct. 31, 2019

(65) Prior Publication Data
US 2021/0098501 A1 Apr. 1, 2021

(30) Foreign Application Priority Data

Apr. 27, 2018 (CN) .......................... 201810391820.6

(51) Int. Cl.
*H01L 27/12* (2006.01)
*H01L 27/32* (2006.01)

(52) U.S. Cl.
CPC ...... *H01L 27/1218* (2013.01); *H01L 27/1262* (2013.01); *H01L 27/326* (2013.01)

(58) Field of Classification Search
CPC ............. H01L 27/3209; H01L 27/3211; H01L 27/3213; H01L 27/322; H01L 51/0011;
(Continued)

(56) References Cited

U.S. PATENT DOCUMENTS

2003/0151574 A1* 8/2003 Chang ................ G02F 1/136286
345/89
2007/0132900 A1* 6/2007 Lee ................... G02F 1/136286
349/38

(Continued)

FOREIGN PATENT DOCUMENTS

| CN | 102629667 A | 8/2012 |
| CN | 104297968 A | 1/2015 |

(Continued)

OTHER PUBLICATIONS

Second Office Action Application No. 201810391820.6; dated Sep. 8, 2020.
(Continued)

*Primary Examiner* — Mohammed Shamsuzzaman

(57) ABSTRACT

A display substrate includes a first substrate, a first sub-pixel layer and a second sub-pixel layer positioned on the first substrate; the first sub-pixel layer includes a plurality of first sub-pixels, the second sub-pixel layer includes a plurality of second sub-pixels, and a first orthographic projection of the first sub-pixel on the first substrate does not overlap with a second orthographic projection of the second sub-pixel on the first substrate. A display panel, a display device and a method for manufacturing the display substrate are also disclosed.

5 Claims, 5 Drawing Sheets

(58) Field of Classification Search
CPC ............. H01L 51/0023; H01L 51/5012; H01L 51/5206; H01L 51/5221; H01L 51/5234; H01L 51/5265; H01L 51/56; H01L 27/1218; H01L 27/1262; H01L 27/326
See application file for complete search history.

(56) References Cited

U.S. PATENT DOCUMENTS

| | | | |
|---|---|---|---|
| 2009/0091613 A1* | 4/2009 | Louwsma | G02B 30/27 348/51 |
| 2011/0243828 A1* | 10/2011 | Gordon | C01C 1/0411 423/360 |
| 2012/0057112 A1* | 3/2012 | Ke | G02F 1/134363 349/114 |
| 2014/0002758 A1* | 1/2014 | Huang | G02B 3/14 349/15 |
| 2014/0198479 A1* | 7/2014 | Chao | H01L 27/3218 362/84 |
| 2016/0004127 A1* | 1/2016 | Qu | G02F 1/136286 257/72 |
| 2017/0053624 A1* | 2/2017 | Hayashi | G09G 5/391 |
| 2017/0104035 A1 | 4/2017 | Lee et al. | |
| 2017/0228580 A1* | 8/2017 | Li | G06K 9/0004 |
| 2017/0261826 A1* | 9/2017 | Chen | H01L 27/124 |
| 2018/0190631 A1* | 7/2018 | Kim | H01L 25/162 |
| 2018/0231850 A1* | 8/2018 | Liu | G02F 1/134336 |
| 2019/0013336 A1* | 1/2019 | Zhang | H01L 27/1225 |
| 2019/0181191 A1* | 6/2019 | Chen | G09G 3/3208 |
| 2020/0168835 A1* | 5/2020 | Fan | H01L 51/5234 |

FOREIGN PATENT DOCUMENTS

| | | |
|---|---|---|
| CN | 104391407 A | 3/2015 |
| CN | 104570372 A | 4/2015 |
| CN | 106328830 A | 1/2017 |
| CN | 106571429 A | 4/2017 |
| CN | 107037641 A | 8/2017 |
| CN | 108598120 A | 9/2018 |
| JP | 4397463 B2 | 1/2010 |
| JP | 20160188782 A | 2/2016 |

OTHER PUBLICATIONS

First Chinese Office Action dated Mar. 5, 2020; Appln No. 201810391820.6.
International Search Report and Written Opinion dated Jan. 30, 2019; PCT/CN2018/117952.

* cited by examiner

DISPLAY SUBSTRATE, MANUFACTURING METHOD THEREOF, DISPLAY PANEL, AND DISPLAY DEVICE

The present disclosure claims priority to Chinese patent application No. 201810391820.6, filed on Apr. 27, 2018, the disclosure of which is incorporated herein by reference in its entirety as part of this disclosure.

TECHNICAL FIELD

The embodiments of the disclosure relate to a display substrate, a manufacturing method thereof, a display panel and a display device.

BACKGROUND

At present, high-resolution display panels, which are the development trend in the display field, are receiving more and more attention. However, with the improvement of resolution, manufacturing the high-resolution display panels faces a series of process problems.

In order to reduce a pixel interval of the display panel, it is necessary to thin a TFT element, a metal trace, a black matrix and other structures, and reduce an interval of pixel definition layer (PDL), which increases the requirement for the manufacturing process and is difficult to realize. Under the current manufacturing capacity of the production line, it is difficult to further increase the pixels per inch (PPI) of the display panel, which greatly limits the development of high-resolution display panel.

SUMMARY

At least an embodiment of the present disclosure provides a display substrate, comprising a first substrate, a first sub-pixel layer and a second sub-pixel layer on the first substrate; the first sub-pixel layer comprises a plurality of first sub-pixels, the second sub-pixel layer comprises a plurality of second sub-pixels, and the first orthographic projection of the first sub-pixel on the first substrate does not overlap with the second orthographic projection of the second sub-pixel on the first substrate.

In an embodiment of the present disclosure, the first sub-pixel layer and the second sub-pixel layer are respectively located on opposite sides of the first substrate.

In an embodiment of the present disclosure, the first sub-pixel layer and the second sub-pixel layer are sequentially disposed on one side of the first substrate.

In an embodiment of the present disclosure, a second substrate is disposed between the first sub-pixel layer and the second sub-pixel layer.

In an embodiment of the present disclosure, a third substrate is disposed between the first sub-pixel layer and the second substrate.

In an embodiment of the present disclosure, a first spacing region is provided between the first sub-pixels, and a second spacing region is provided between the second sub-pixels; the first sub-pixel is arranged corresponding to the second spacing region, and the second sub-pixel is arranged corresponding to the first spacing region.

In an embodiment of the present disclosure, a width of the first spacing region is larger than a width of the second sub-pixel corresponding to the first spacing region; a width of the second spacing region is larger than a width of the first sub-pixel corresponding to the second spacing region.

In an embodiment of the present disclosure, the first spacing region is provided with a first pixel definition layer and the second spacing region is provided with a second pixel definition layer.

In an embodiment of the present disclosure, a pitch between the first sub-pixel and the second sub-pixel adjacent to the first sub-pixel in a direction parallel to the first substrate is smaller than a pixel interval between the first sub-pixels in the first sub-pixel layer and smaller than a pixel interval between the second sub-pixels in the second sub-pixel layer.

At least an embodiment of the present disclosure provides a display panel including the display substrate as mentioned above and a packaging structure configured to package the display substrate.

In an embodiment of the present disclosure, the packaging structure is a glass cover plate, a metal cover plate, or a multilayer film.

At least an embodiment of the present disclosure provides a display device including the above display substrate.

At least an embodiment of the present disclosure provides a manufacturing method of a display substrate, including: forming a first sub-pixel layer on a first substrate, wherein the first sub-pixel layer comprises a plurality of first sub-pixels; forming a second sub-pixel layer on the first substrate, the second sub-pixel layer comprising a plurality of second sub-pixels. A first orthographic projection of the first sub-pixel on the first substrate does not overlap with a second orthographic projection of the second sub-pixel on the first substrate.

In an embodiment of the present disclosure, the forming of the second sub-pixel layer on the first substrate includes forming the second sub-pixel layer on a side of the first sub-pixel layer away from the first substrate.

In an embodiment of the present disclosure, the forming of the second sub-pixel layer on the first substrate includes forming the second sub-pixel layer on the other side of the first substrate on which the first sub-pixel layer is formed.

BRIEF DESCRIPTION OF THE DRAWINGS

In order to more clearly explain the technical scheme of the embodiments of the present disclosure, the following will briefly introduce the drawings of the embodiments. Obviously, the drawings in the following description only refer to some embodiments of the present disclosure, and not to the limitations of the present disclosure.

DETAILED DESCRIPTION

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Figure 1:
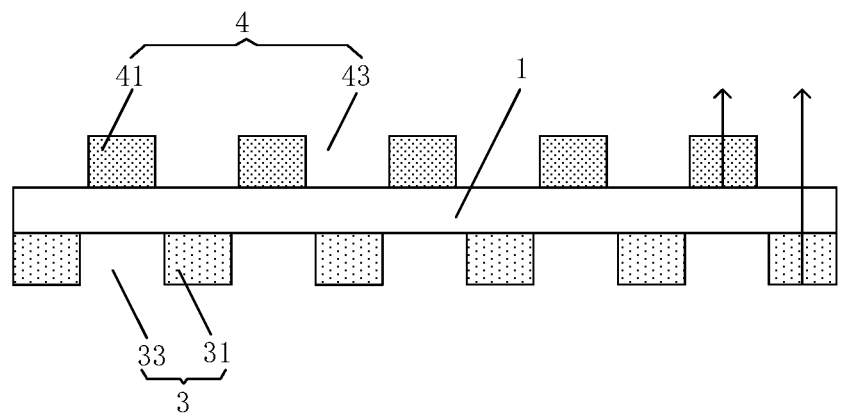
FIG. 1 is a schematic structural diagram of a display substrate according to an embodiment of the present disclosure.

FIG. 1 is a schematic structural diagram of a display substrate according to one embodiment of the present disclosure. As shown in FIG. 1, the display substrate includes a first substrate 1, a first sub-pixel layer 3 and a second sub-pixel layer 4 located on the first substrate 1, wherein the first sub-pixel layer 3 includes a plurality of first sub-pixels 31, the second sub-pixel layer 4 includes a plurality of second sub-pixels 41, and a first orthographic projection of the first sub-pixel 31 on the first substrate 1 does not overlap with a second orthographic projection of the second sub-pixel 41 on the first substrate 1.

In present embodiment, the first sub-pixel layer 3 and the second sub-pixel layer 4 are respectively located on opposite sides of the first substrate 1. For example, if the first sub-pixel layer 3 is located on a first side of the first substrate 1, the second sub-pixel layer 4 is located on a second side of the second substrate 1 opposite to the first side. As shown in FIG. 1, the first sub-pixel layer 3 is located below the first substrate 1, and the second sub-pixel layer 4 is located above the first substrate 1.

Optionally, the first sub-pixel layer 3 and the second sub-pixel layer 4 may also be located on the same side of the first substrate 1.

The display substrate according to the embodiment of the present disclosure is provided with two sub-pixel layers, the first orthographic projection of the first sub-pixel in the first sub-pixel layer on the first substrate and the second orthographic projection of the second sub-pixel in the second sub-pixel layer on the first substrate do not overlap, and a pixel pitch between the first sub-pixel and the second sub-pixel adjacent to the first sub-pixel can be reduced without changing the pixel interval of the sub-pixels in each sub-pixel layer, thereby improving PPI of the display substrate.

Figure 2:
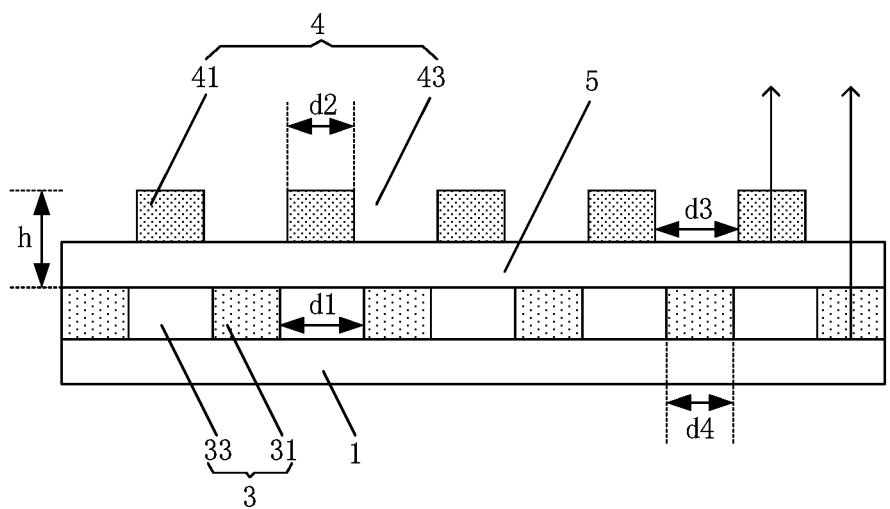
FIG. 2 is a schematic structural diagram of a display substrate according to yet another embodiment of the present disclosure.
Figure 3:
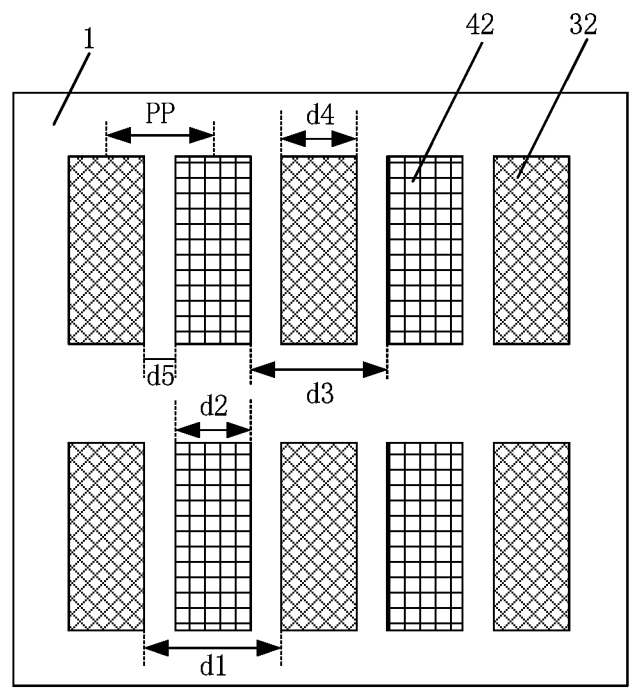
FIG. 3 is a schematic diagram of orthographic projections of a first sub-pixel and a second sub-pixel in FIG. 2.

FIG. 2 is a structural schematic diagram of a display substrate according to yet another embodiment of the present disclosure, and FIG. 3 is a schematic diagram of orthographic projections of the first sub-pixel and the second sub-pixel in FIG. 2. As shown in FIG. 2 and FIG. 3, the display substrate includes a first substrate 1, a first sub-pixel layer 3 and a second sub-pixel layer 4 located on the first substrate 1, the first sub-pixel layer 3 includes a plurality of first sub-pixels 31, the second sub-pixel layer 4 includes a plurality of second sub-pixels 41, and a first orthographic projection 32 of the first sub-pixel 31 on the first substrate 1 does not overlap with a second orthographic projection 42 of the second sub-pixel 41 on the first substrate 1.

In the embodiment shown in FIG. 2, the first sub-pixel layer 3 and the second sub-pixel layer 4 are located on the same side of the first substrate 1. The first sub-pixel layer 3 and the second sub-pixel layer 4 are sequentially arranged on one side of the first substrate 1, wherein the second sub-pixel layer 4 is located on a side of the first sub-pixel layer 3 away from the first substrate 1.

In the embodiment shown in FIG. 2, a second substrate 5 is provided between the first sub-pixel layer 3 and the second sub-pixel layer 4. The first sub-pixel layer 3 is located between the first substrate 1 and the second substrate 5, and the second sub-pixel layer 4 is located on a side of the second substrate 5 away from the first sub-pixel layer 3. In the illustrated structure, the first sub-pixel layer 3 is located on the first substrate 1 and the second sub-pixel layer 4 is located on the second substrate 5. Of course, the first sub-pixel layer 3 and the second sub-pixel layer 4 may both be located on the second substrate 5.

As shown in FIG. 2, a first spacing region 33 is provided between the first sub-pixels 31, and a second spacing region 43 is provided between the second sub-pixels 41. In the first sub-pixel layer 3, a plurality of first sub-pixels 31 are sequentially arranged, and the plurality of first sub-pixels 31 are arranged at intervals, and the first spacing region 33 is arranged between adjacent first sub-pixels 31; in the second sub-pixel layer 4, a plurality of second sub-pixels 41 are sequentially arranged, and the plurality of second sub-pixels 41 are arranged at intervals, and the second spacing region 43 is arranged between adjacent second sub-pixels 41. The first sub-pixel 31 is disposed corresponding to the second spacing region 43, and the second sub-pixel 41 is disposed corresponding to the first spacing region 33. As shown in FIG. 3, an orthographic projection of the first sub-pixel 31 on the first substrate and an orthographic projection of the second sub-pixel 41 on the first substrate are alternately arranged.

As shown in FIG. 2 and FIG. 3, a width d1 of the first spacing region 33 is larger than a width d2 of the corresponding second sub-pixel 41; a width d3 of the second spacing region 43 is larger than a width d4 of the corresponding first sub-pixel 31.

Figure 5:
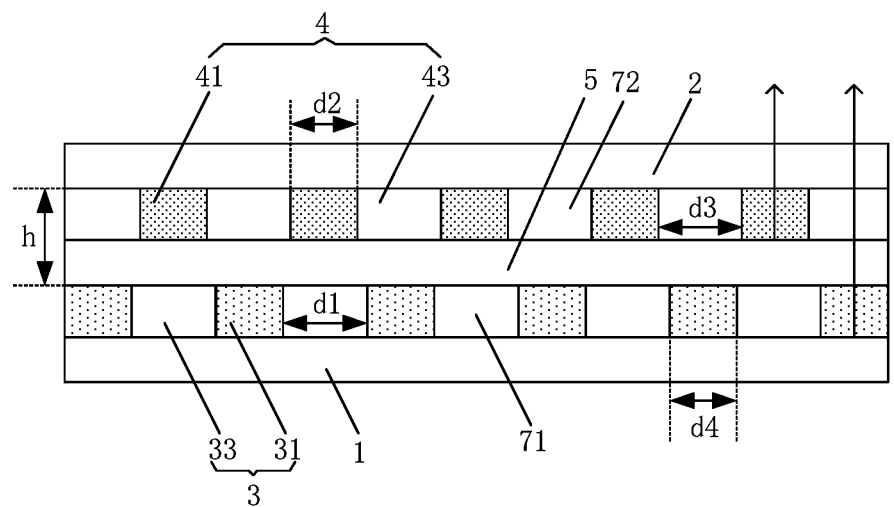
FIG. 5 is a schematic structural diagram of a display panel according to yet another embodiment of the present disclosure.
Figure 6:
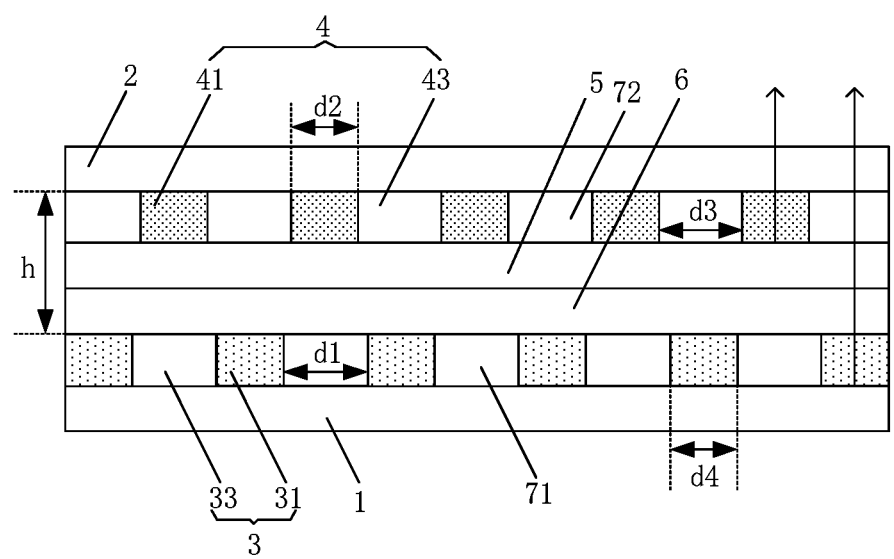
FIG. 6 is a schematic structural diagram of a display panel according to yet another embodiment of the present disclosure.

The first spacing region 33 is provided with a first pixel definition layer 71, and the second spacing region 43 is provided with a second pixel definition layer 72. In other words, the first pixel definition layer 71 is filled in the first spacing region 33 and the second pixel definition layer 72 is filled in the second spacing region 43. It should be noted that in FIG. 2, in order to clearly illustrate the first spacing region 33 and the second spacing region 43, the first pixel definition layer and the second pixel definition layer are not shown in FIG. 2, but are shown in FIG. 5 and FIG. 6.

In an embodiment of the present disclosure, the display substrate includes an OLED display substrate. The first sub-pixel 31 includes an OLED light emitting element, and the second sub-pixel 41 includes an OLED light emitting element. As shown in FIG. 2, since light emitted by the first sub-pixel 31 needs to exit through the second spacing region 43, the second spacing region 43 is a transparent region, and the pixel definition layer disposed therein needs to be able to transmit light. Opaque structures, such as a TFT element, a metal trace, a black matrix and the like, do not disposed in the second spacing region 43, and the above-mentioned various opaque structures may be disposed in a region where the second sub-pixel 41 is located, for example, under the second sub-pixel 41. In this embodiment, since the first spacing region 33 may not have a light transmission function, the first spacing region 33 may also be provided with opaque structures such as a TFT element, a metal trace, a black matrix and the like, in addition to the pixel definition layer. Alternatively, the above-mentioned various opaque structures may be disposed in a region where the first sub-pixel 31 is located, for example, under the first sub-pixel 31, and the present disclosure is not limited thereto.

As shown in FIG. 3, a pixel pitch PP between the first sub-pixel 31 and the adjacent second sub-pixel 41 is a distance between a center line of a first orthographic projection 32 and a center line of an adjacent second orthographic projection 42. The pixel pitch PP between the first sub-pixel 31 and the adjacent second sub-pixel 41 is smaller than a pixel interval d1 between the first sub-pixels 31 in the first sub-pixel layer and smaller than a pixel interval d3 between the second sub-pixels 41 in the second sub-pixel layer 4. For example, the pixel pitch PP between the first sub-pixel 31 and the adjacent second sub-pixel 41 is ½ of the pixel interval d1 between the first sub-pixels 31 in the first sub-pixel layer 3, and the pixel pitch PP between the first sub-pixel 31 and the adjacent second sub-pixel 41 is ½ of the pixel interval d3 between the second sub-pixels 41 in the second sub-pixel layer 4. For example, if the pixel interval between the first sub-pixels 31 in the first sub-pixel layer 3 is 28.2 µm, and if the pixel interval between the second sub-pixels 41 in the second sub-pixel layer 4 is 28.2 µm, the pixel pitch PP between the first sub-pixel 31 and the adjacent second sub-pixel 41 is 14.1 µm. In the technology known by the inventor, if the display substrate adopts a single-layer sub-pixel layer structure and the pixel interval between sub-pixels in the sub-pixel layer is 28.2 µm, the display PPI seen by human eyes can reach 300 PPI. From the above, it can be seen that in the present disclosure, the pixel pitch between the first sub-pixel 31 and the adjacent second sub-pixel 41 can be further reduced without changing the pixel interval between the sub-pixels in each sub-pixel layer, so that the display PPI seen by human eyes can reach 600 PPI, and the PPI of the display substrate is improved compared with the technology known by the inventor, thereby improving the display effect.

In an embodiment of the present disclosure, the first sub-pixel layer 3 and the second sub-pixel layer 4 jointly display a picture under the driving of the driving device. Alternatively, the first sub-pixel layer independently displays a picture and the second sub-pixel layer independently display a picture under the driving of the driving device, thereby realizing PPI switching of the display substrate, and enabling the display substrate to be in a low power consumption mode.

As shown in FIG. 3, a distance d5 between the first orthographic projection 32 and the adjacent second orthographic projection 42 is greater than 0.

The display substrate according to this embodiment is provided with two sub-pixel layers. The first orthographic projection of the first sub-pixel in the first sub-pixel layer on the first substrate and the second orthographic projection of the second sub-pixel in the second sub-pixel layer on the first substrate do not overlap. Under the condition of not changing the pixel interval of the sub-pixels in each sub-pixel layer, the pixel pitch between the first sub-pixel and the second sub-pixel adjacent to the first sub-pixel can be reduced, thus improving PPI of the display substrate. The display substrate according to the embodiment of the present disclosure is suitable for the field of near-eye display.

Figure 4:
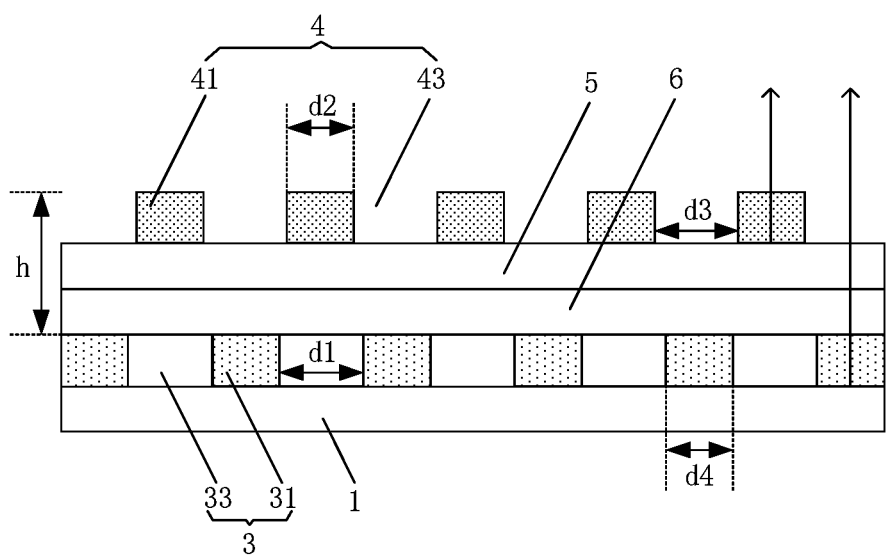
FIG. 4 is a schematic structural diagram of a display substrate according to yet another embodiment of the present disclosure.

FIG. 4 is a schematic structural diagram of a display substrate according to yet another embodiment of the present disclosure, as shown in FIG. 4, the display substrate further includes a third substrate 6 located between the first sub-pixel layer 3 and the second substrate 5.

The description of other structures of the display substrate may refer to the description of the embodiment shown in FIG. 2 and FIG. 3, and the structure thereof will not be repeated here.

The display substrate according to the present embodiment is provided with two sub-pixel layers, and the first orthographic projection of the first sub-pixel in the first sub-pixel layer on the first substrate does not overlap with the second orthographic projection of the second sub-pixel in the second sub-pixel layer on the first substrate. Therefore, the pixel pitch between the first sub-pixel and the second sub-pixel adjacent to the first sub-pixel can be reduced without changing the pixel interval of sub-pixels in each sub-pixel layer, thereby improving PPI of the display substrate.

FIG. 5 is a schematic structural diagram of a display panel according to yet another embodiment of the present disclosure, as shown in FIG. 5, the display panel includes a display substrate and a package structure 2 configured to package the display substrate.

The display substrate may adopt a display substrate according to the embodiment shown in FIG. 2, and the structure thereof will not be repeatedly described here. The packaging structure 2 may be a glass cover plate, a metal cover plate or a multilayer film.

The display panel according to the present embodiment is provided with two sub-pixel layers, the first orthographic projection of the first sub-pixel in the first sub-pixel layer on the first substrate and the second orthographic projection of the second sub-pixel in the second sub-pixel layer on the first substrate do not overlap, and the pixel pitch between the first sub-pixel and the second sub-pixel adjacent to the first sub-pixel can be reduced without changing the pixel interval of the sub-pixels in each sub-pixel layer, thereby improving PPI of the display substrate.

FIG. 6 is a schematic structural diagram of a display panel according to yet another embodiment of the present disclosure, as shown in FIG. 6, the display panel includes a display substrate and a package structure 2 configured to package the display substrate.

The display substrate may adopt a display substrate according to the embodiment shown in FIG. 4, and the structure thereof will not be repeatedly described here. The packaging structure 2 may be a glass cover plate, a metal cover plate or a multilayer film.

The display panel according to the present embodiment is provided with two sub-pixel layers, the first orthographic projection of the first sub-pixel in the first sub-pixel layer on the first substrate and the second orthographic projection of the second sub-pixel in the second sub-pixel layer on the first substrate do not overlap, and the pixel pitch between the first sub-pixel and the second sub-pixel adjacent to the first sub-pixel without changing the pixel interval of the sub-pixels in each sub-pixel layer, thereby improving PPI of the display substrate.

At least an embodiment of the present disclosure provides a display device including any of the above display substrates.

The display device according to the embodiment of the present disclosure is provided with two sub-pixel layers, and the first orthographic projection of the first sub-pixel in the first sub-pixel layer on the first substrate and the second orthographic projection of the second sub-pixel in the second sub-pixel layer on the first substrate do not overlap, so that the pixel pitch between the first sub-pixel and the second sub-pixel adjacent to the first sub-pixel without changing the pixel interval of the sub-pixels in each sub-pixel layer, thereby improving PPI of the display substrate.

Figure 7:
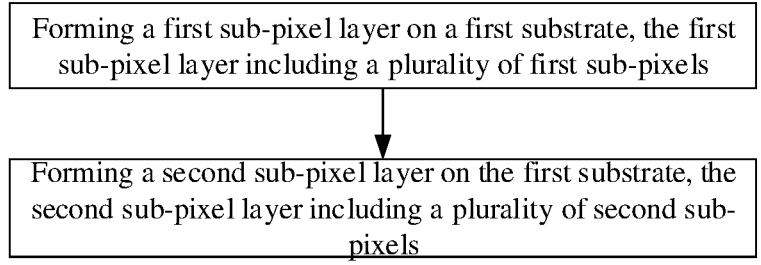
FIG. 7 is a flowchart of a manufacturing method of a display substrate according to an embodiment of the present disclosure.

At least an embodiment of the present disclosure provides a manufacturing method of a display substrate. As shown in FIG. 7, the method includes:

Forming a first sub-pixel layer on a first substrate, wherein the first sub-pixel layer comprises a plurality of first sub-pixels; and Forming a second sub-pixel layer over the first substrate, the second sub-pixel layer including a plurality of second sub-pixels.

In the embodiment, the first orthographic projection of the first sub-pixel on the first substrate does not overlap with the second orthographic projection of the second sub-pixel on the first substrate.

In an embodiment of the present disclosure, the forming a second sub-pixel layer over the first substrate, the second sub-pixel layer including a plurality of second sub-pixels may include forming the second sub-pixel layer on a side of the first sub-pixel layer away from the first substrate. A structure of the formed display substrate is shown in FIG. 4 or FIG. 5.

In an embodiment of the present disclosure, the forming a second sub-pixel layer over the first substrate, the second sub-pixel layer including a plurality of second sub-pixels may include forming the second sub-pixel layer on the other side of the first substrate on which the first sub-pixel layer is formed. The structure of the formed display substrate is shown in FIG. 2.

After forming the display substrate, further, a packaging structure may be formed on the second sub-pixel layer such that the first sub-pixel layer and the second sub-pixel layer are located between the packaging structure and the first substrate, and the first orthographic projection of the first sub-pixel on the first substrate and the second orthographic projection of the second sub-pixel on the first substrate do not overlap.

The display substrate manufactured by the manufacturing method of the display substrate according to the embodiment of the disclosure is provided with two sub-pixel layers, and the first orthographic projection of the first sub-pixel in the first sub-pixel layer on the first substrate and the second orthographic projection of the second sub-pixel in the second sub-pixel layer on the first substrate do not overlap, so that the pixel pitch between adjacent first sub-pixels and second sub-pixels can be reduced without changing the pixel interval of the sub-pixels in each sub-pixel layer, thereby improving PPI of the display substrate. The method does not need to improve the manufacturing process, is simple in process and easy to realize, and reduces the technological difficulty of manufacturing the high-resolution display panel.

Figure 8:
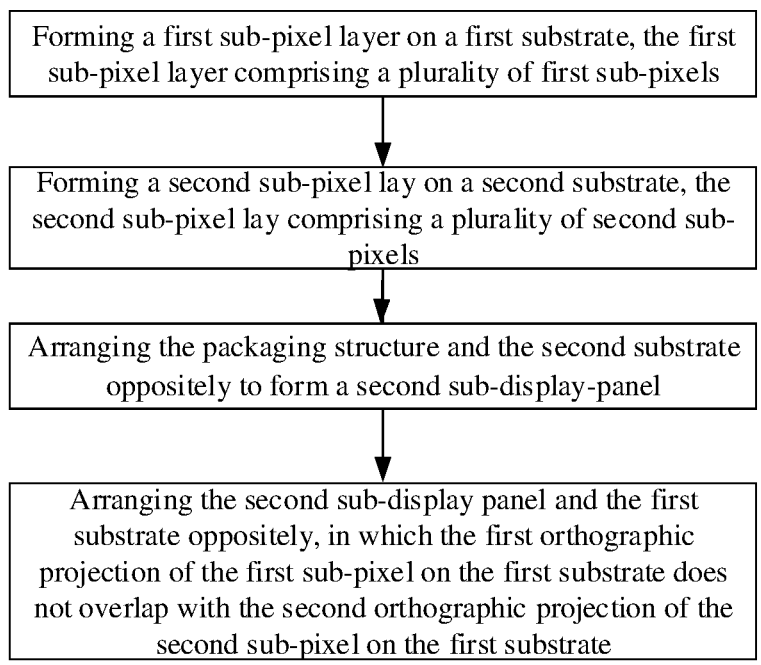
FIG. 8 is a flowchart of a manufacturing method of a display panel according to an embodiment of the present disclosure.

At least an embodiment of the present disclosure provides a manufacturing method of a display panel. FIG. 8 shows a flowchart of a manufacturing method of a display panel according to one embodiment of the present disclosure. As shown in FIG. 8, the method includes:

Forming a first sub-pixel layer on a first substrate, the first sub-pixel layer comprising a plurality of first sub-pixels;

Forming a second sub-pixel layer on a second substrate, the second sub-pixel layer comprise a plurality of second sub-pixels;

Arranging the packaging structure and the second substrate oppositely to form a second sub-display-substrate; and Arranging the second sub-display-substrate and the first substrate oppositely, in which the first orthographic projection of the first sub-pixel on the first substrate does not overlap with the second orthographic projection of the second sub-pixel on the first substrate.

In the above method, the packaging structure and the second substrate are oppositely arranged to form a second sub-display-substrate, and the packaging of the second substrate is realized through the packaging structure.

In the above method, the second sub-display-substrate and the first substrate are oppositely arranged through a bonding process, and the second substrate in the second sub-display-substrate is close to the first substrate in the bonding process to form a display panel.

A structure of the display panel made by the manufacturing method of the display panel according to the present embodiment is shown in FIG. 5, and its structure will not be described here.

The display panel manufactured by the manufacturing method of the display panel according to the embodiment is provided with two sub-pixel layers, the first orthographic projection of the first sub-pixel in the first sub-pixel layer on the first substrate and the second orthographic projection of the second sub-pixel in the second sub-pixel layer on the first substrate do not overlap, and the pixel pitch between adjacent first sub-pixels and second sub-pixels can be reduced without changing the pixel interval of the sub-pixels in each sub-pixel layer, thereby improving PPI of the display substrate. The method does not need to modify the manufacturing process, is simple in process and easy to realize, thereby reducing the process difficulty of manufacturing the high-resolution display panel.

Figure 9:
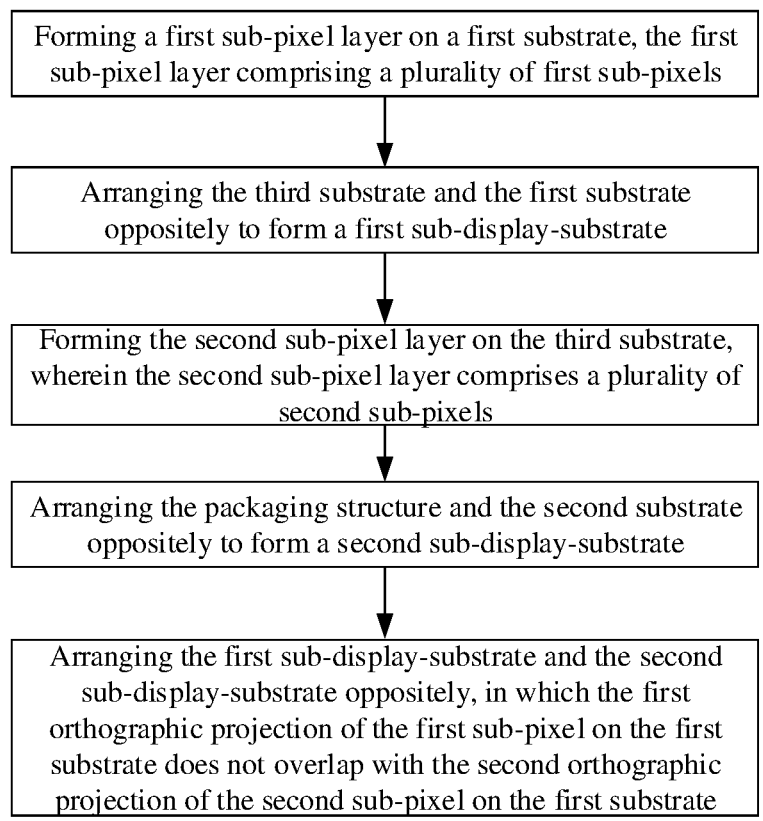
FIG. 9 is a flowchart of a manufacturing method of a display panel according to yet another embodiment of the present disclosure.

FIG. 9 shows a flowchart of a manufacturing method of a display panel according to yet another embodiment of the present disclosure. As shown in FIG. 9, the method includes:

Forming a first sub-pixel layer on a first substrate, the first sub-pixel layer comprising a plurality of first sub-pixels;

Arranging a third substrate and the first substrate oppositely to form a first sub-display-substrate;

Forming a second sub-pixel layer on the third substrate, wherein the second sub-pixel layer comprises a plurality of second sub-pixels;

Arranging the packaging structure and the second substrate oppositely to form a second sub-display-substrate; and Arranging the first sub-display-substrate and the second sub-display-substrate oppositely, in which the first orthographic projection of the first sub-pixel on the first substrate and the second orthographic projection of the second sub-pixel on the first substrate do not overlap.

In the method according to the embodiment, the second substrate is packaged by the third substrate and the second substrate is packaged by the packaging structure. In addition, in the bonding process, the second sub-display-substrate and the first sub-display-substrate are arranged to opposite to each other, and the second substrate in the second sub-display-substrate is close to the first substrate to form the display panel.

The structure of the display panel made by the manufacturing method of the display panel according to the embodiment is shown in FIG. 6, and the structure thereof will not be described here.

The display panel manufactured by the manufacturing method of the display panel according to the embodiment is provided with two sub-pixel layers, the first orthographic projection of the first sub-pixel in the first sub-pixel layer on the first substrate and the second orthographic projection of the second sub-pixel in the second sub-pixel layer on the first substrate do not overlap, and the pixel pitch between adjacent first sub-pixels and second sub-pixels can be reduced without changing the pixel interval of the sub-pixels in each sub-pixel layer, thereby improving PPI of the display substrate. The method does not need to modify the manufacturing process, is simple in process and easy to realize, thereby reducing the process difficulty of manufacturing the high-resolution display panel.

The above description is merely an exemplary embodiment of the present disclosure and is not intended to limit the scope of protection of the present disclosure, which is determined by the appended claims.

What is claimed is:

1. A display substrate comprising: a first substrate, a first sub-pixel layer and a second sub-pixel layer on the first substrate,
   wherein the first sub-pixel layer comprises a plurality of first sub-pixels, the second sub-pixel layer comprises a plurality of second sub-pixels, a first orthographic projection of the plurality of first sub-pixels on the first substrate and a second orthographic projection of the plurality of second sub-pixels on the first substrate do not overlap, and the first sub-pixel layer and the second sub-pixel layer are not on a same plane;
   a first spacing region is between the first sub-pixels, and a second spacing region is between the second sub-pixels;
   one of the plurality of first sub-pixels is arranged corresponding to the second spacing region, and one of the plurality of second sub-pixels is arranged corresponding to the first spacing region;
   a width of the first spacing region is larger than a width of the one of the plurality of second sub-pixels corresponding to the first spacing region;
   a width of the second spacing region is larger than a width of the one of the plurality of first sub-pixels corresponding to the second spacing region;
   the first sub-pixel layer and the second sub-pixel layer are sequentially located on a side of the first substrate in a direction perpendicular to the first substrate;
   a second substrate is between the first sub-pixel layer and the second sub-pixel layer, and
   a third substrate is between the first sub-pixel layer and the second substrate,
   wherein a pitch between the first sub-pixel and the second sub-pixel adjacent to the first sub-pixel in a direction parallel to the first substrate is half of a pixel interval between the first sub-pixels in the first sub-pixel layer and half of a pixel interval between the second sub-pixels in the second sub-pixel layer.

2. The display substrate according to claim 1, wherein a first pixel definition layer is in the first spacing region and a second pixel definition layer is in the second spacing region.

3. A display panel, comprising a package structure, the package structure being configured to package the display substrate according to claim 1.

4. The display panel according to claim 3, wherein the packaging structure is a glass cover plate, a metal cover plate or a multilayer film.

5. A display device, comprising: the display substrate according to claim 1.

* * * * *